United States Patent [19]

Petty

[11] Patent Number: 4,939,393
[45] Date of Patent: Jul. 3, 1990

[54] ECL TO TTL/CMOS TRANSLATOR USING A SINGLE POWER SUPPLY

[75] Inventor: Cleon Petty, Tempe, Ariz.

[73] Assignee: Motorola Inc., Schaumburg, Ill.

[21] Appl. No.: 415,846

[22] Filed: Oct. 2, 1989

[51] Int. Cl.[5] .................. H03K 17/16; H03K 19/086; H03K 19/092

[52] U.S. Cl. ..................................... 307/475; 307/443; 307/455; 307/263; 307/542

[58] Field of Search ........................ 307/443, 454-455, 307/473, 475, 572, 263, 542, 543, 556

[56] References Cited

U.S. PATENT DOCUMENTS 4,754,171  6/1988  Dasai et al. ........................... 307/455
4,849,659  7/1989  West ..................................... 307/475

FOREIGN PATENT DOCUMENTS 0133725  8/1982  Japan ..................................... 307/475

Primary Examiner—Stanley D. Miller
Assistant Examiner—Margaret Rose Wanbach
Attorney, Agent, or Firm—Michael D. Bingham

[57] ABSTRACT

An single power supply ECL to TTL/CMOS translator is provided for converting a signal from differential ECL logic levels to TTL or CMOS compatible logic levels without introducing current spikes in the output signal during logic transitions. The differential ECL input signal is transformed into first and second differentially related signals having predetermined differential and single ended magnitudes. The first and second differentially related signals are then buffered and applied, as independent single ended signals, to first and second conduction paths controlling the first and second switching circuits in an output stage, respectively. The relative magnitudes of the first and second differentially related signals at the output of the buffer induce unequal slew rates at the input of the first and second conduction paths such that the first switching circuit is turned off before the second switching circuit is turn on thereby preventing simultaneous conduction and the associated undesirable current spikes flowing therethrough.

32 Claims, 2 Drawing Sheets

ECL TO TTL/CMOS TRANSLATOR USING A SINGLE POWER SUPPLY

BACKGROUND OF THE INVENTION

The present invention relates in general to voltage translators, and more particularly, to an ECL to TTL/CMOS logic level translator operative with a single power supply and utilizing time constants for controlling the slew rate of the propagating signal to prevent current spikes in the output switching stage.

It is well known that many of today's complex systems mix and match integrated circuits (ICs) of different logic families to accomplish a series of interrelated functions. In one example, signals produced in one logic family, ECL, are translated to levels compatible with another logic family, TTL, or possibly CMOS, for further processing. A typical ECL to TTL/CMOS translator converts a differential ECL input signal to first and second complementary control voltages for driving upper and lower transistors of an output stage, respectively. The collector-emitter conduction paths of the upper and lower transistors are serially coupled between a positive supply voltage, $V_{CC}$, and ground potential, and the complementary control voltages are generated in separate conduction paths coupled between power supplies, $V_{CC}$ and $V_{EE}$, typically operating at 5 volts and −5 volts, respectively. During logic transitions, however, as the differential ECL input signal passes through zero, the upper and lower transistors of the output stage may conduct simultaneously allowing undesirably large currents to flow therebetween. These current spikes induce noise into the power supplies causing a myriad of problems in adjacent circuits including false logic switching. As the frequency of operation increases so does the magnitude of the current spikes and, correspondingly, the extent of the noise problem.

Another limitation of the conventional ECL to TTL/CMOS translator is the requirement for dual power supplies. It would be desirable for the translator to be operative with a single power supply simplifying the interface to external circuitry wherein a dual power supply is not readily available.

Hence, there is a need for an improved ECL to TTL/CMOS translator which eliminates current spikes in the output stage during logic transitions and operates with a single power supply.

SUMMARY OF THE INVENTION

It is therefore an objective of the present invention to provide an improved voltage translator.

A further objective of the present invention is to provide an improved voltage translator operative with a single power supply.

Another objective of the present invention is to provide an improved voltage translator free of current spikes in the output stage.

Still another objective of the present invention is to provide an improved voltage translator for receiving ECL signals and translating to TTL or CMOS compatible logic levels.

Yet another objective of the present invention is to provide an improved voltage translator having a wide dynamic input range and increased sensitivity for low level differential input signals.

In accordance with the above and other objectives there is provided an improved voltage translator responsive to a differential logic input signal having first predetermined logic levels for providing an output signal having second predetermined logic levels comprising, an input stage responsive to the differential logic input signal and having first and second outputs for providing first and second differentially related signals in response thereto wherein the first and second differentially related signals have a predetermined differential magnitude; a circuit for translating the first and second differentially related signals wherein the translating circuit is responsive to a bias signal for establishing first and second single-ended levels of the translated first and second differentially related signals while maintaining the predetermined differential magnitude; and an output stage including first and second switching circuits serially coupled between first and second sources of operating potential. The first and second switching circuits are responsive to the first and second single-ended levels of the translated first and second differentially related signals for providing the second predetermined logic levels of the output signal wherein the slew rates of the translated first and second differentially related signals prevent simultaneously conduction through the first and second switching circuits.

DESCRIPTION OF THE PREFERRED EMBODIMENT

Figure 1:
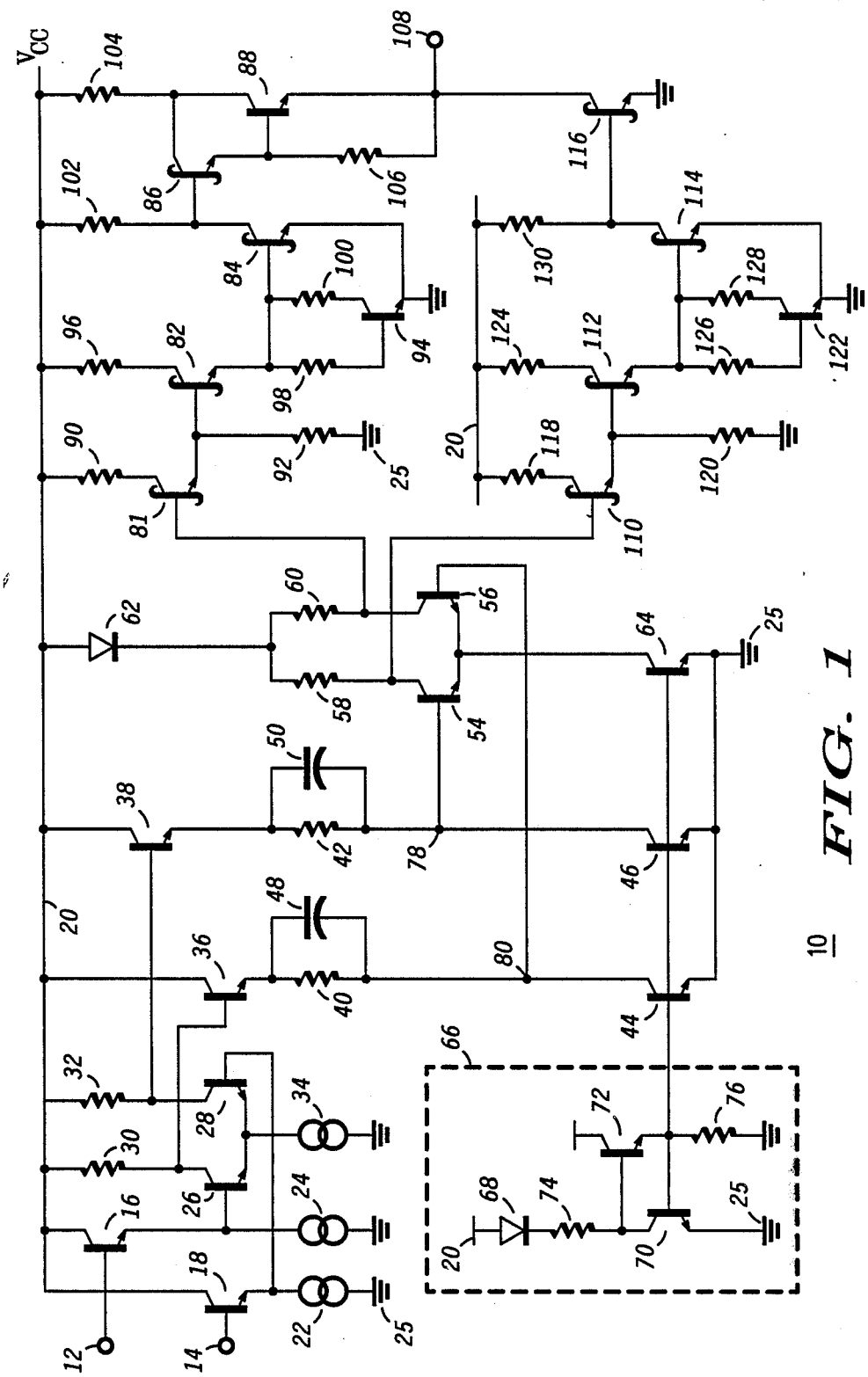
FIG. 1 is a schematic diagram showing one embodiment of the present invention.

Referring to FIG. 1, voltage translator 10 is shown as one embodiment of the present invention having inputs 12 and 14 coupled for receiving a differential ECL input signal at the bases of transistors 16 and 18 respectively. The collector-emitter conduction paths of transistors 16 and 18 are respectively coupled between power supply conductor 20, typically operating at a positive potential such as +5 volts, and current supplies 22 and 24. The differential ECL input signal is voltage level shifted by the base-emitter junction potentials, $V_{be}$, of transistors 16 and 18 in the signal path. The conduction path for current supplies 22 and 24 is completed through power supply conductor 25 operating at ground potential. The emitters of transistors 16 and 18 are coupled to the bases of differentially coupled transistors 26 and 28, the collectors of which are coupled through resistors 30 and 32 to power supply conductor 20, respectively, while the emitters are coupled together to current supply 34. The values of resistors 30 and 32 and the magnitude of the current flowing in current supply 34 are selected such that a predetermined differential voltage, approximately 400 millivolts (mv), is developed across the collectors of transistors 26 and 28 in response to the differential ECL signal. The combination of transistors 16, 18, 26 and 28, current supplies 22, 24 and 34 and resistors 30 and 32 form an input stage for providing the 400 mv differential signal which is then applied to the bases of transistors 36 and 38, the collectors of which are coupled to power supply conductor 20. The emitters of these transistors are coupled through resistors 40 and 42 to the collectors of transistors 44 and 46 respectively. To complete the conduction path, the emitters of transistors 44 and 46 are coupled to power supply conductor 25. Capacitors 48 and 50 are coupled in parallel with resistors 40 and 42 respectively to provide a conventional bi-pass path for the high frequency components of the differential signal flowing therethrough.

The collectors of transistors 46 and 44 are respectively coupled to the bases of differentially coupled transistors 54 and 56, the collectors of which are coupled through resistors 58 and 60 to the cathode of diode 62. The anode of diode 62 is coupled to power supply conductor 20, and the emitters of transistors 54 and 56 are coupled together to the collector of transistor 64, while the emitter of the latter is coupled to power supply conductor 25.

Bias circuit 66, comprising diode 68, transistors 70 and 72 and resistors 74 and 76, is provided to establish a predetermined, temperature compensated voltage, typically 2 volts, at the bases of transistors 54 and 56 which are nodes 78 and 80 respectively. The anode of diode 68 is coupled to power supply conductor 20, and the cathode is coupled through resistor 74 to the collector of transistor 70. The collector and base of transistor 70 are respectively coupled to the base and emitter of transistor 72. The collector of transistor 72 and the emitter of transistor 70 are coupled to power supply conductors 20 and 25 respectively. The bases of transistors 70, 44, 46 and 64 are coupled together, and the base of transistor 70 is coupled through resistor 76 to power supply conductor 25. The values of resistors 74 and 76 are selected to establish the appropriate voltage at the bases of transistors 44 and 46 to induce collector currents to flow therethrough, which in turn develop the aforementioned predetermined voltages at nodes 78 and 80.

The potential developed at the collector of transistor 56 provides the drive signal for the upper signal path comprising transistors 81, 82, 84, 86 and 88 the latter of which, when enabled, activates a high output signal. The upper drive signal is applied to the base of transistor 81, the collector and emitter of which are coupled to power supply conductors 20 and 25 through resistors 90 and 92 respectively. The upper drive signal is reduced through the $V_{be}$ of transistor 81 and then applied to the base of transistor 82. The collector and emitter of transistor 82 are coupled to power supply conductor 20 and to the base of transistor 94 through resistors 96 and 98 respectively, and the collector and emitter of transistor 94 are coupled to the emitter of transistor 82 and power supply conductor 25, the former path including resistor 100. The combination of transistor 94 and resistors 98 and 100 operate as a diode to develop sharp rise and falls times for the signal flowing therethrough for providing improved the noise margin of the output signal. The base of transistor 84 is then coupled to the emitter of transistor 82, while the emitter of the former is coupled to power supply conductor 25. The collector of transistor 84 is coupled to the base of transistor 86 and to power supply conductor 20 via resistor 102. The collectors of transistors 86 and 88 are coupled together through resistor 104 to power supply conductor 20, and the emitter of transistor 86 is coupled to the base and emitter of transistor 88 the latter path including resistor 106. The emitter of transistor 88 is also coupled to output terminal 108.

Correspondingly, the voltage developed at the collector of transistor 54 provides the drive signal for the lower signal path comprising transistors 110, 112, 114 and 116 the latter of which, when enabled, activates a low output signal. The lower drive signal is applied to the base of transistor 110, the collector and emitter of which are coupled to power supply conductors 20 and 25 through resistors 118 and 120 respectively. The voltage developed at the emitter of transistor 110 is applied to the base of transistor 112. The collector and emitter of transistor 112 are coupled to power supply conductor 20 and to the base of transistor 122 through resistors 124 and 126 respectively, while the collector and emitter of transistor 122 are coupled to the emitter of transistor 112 and power supply conductor 25 the former path including resistor 128. The base of transistor 114 is then coupled to the emitter of transistor 112, and the emitter of the former is coupled to power supply conductor 25. The collector of transistor 114 is coupled to the base of transistor 116 and to power supply conductor 20 via resistor 130. The collector of transistor 116 is coupled to output terminal 108, and the emitter of the same is coupled to power supply conductor 25. The combination of Darlington-coupled transistors 86 and 88 and transistor 116 provide a conventional TTL compatible output signal. It should be well understood that these transistors may be exchanged with a conventional CMOS output stage to achieve CMOS compatible logic levels.

In the operation of voltage translator 10, a differential ECL signal is applied at inputs 12 and 14 and voltage level shifted through the $V_{be}$ of transistors 16 and 18 and then applied to the bases of balanced differential transistor pair 26 and 28. If the magnitude of the signal applied at input 12 is greater than that applied at input 14, transistor 26 is rendered more conductive that transistor 28 and, consequently, the voltage at the collector of transistor 28 is greater than the voltage at the collector of transistor 26. The values of resistors 30 and 32 and the magnitude of current flowing in current supply 34 are selected such that a predetermined differential signal, typically 400 mv, is developed thereacross. Hence, the combination of transistors 16, 18, 26 and 28 forms an input buffer stage for accepting a differential ECL input signal having a differential range typically from 150 mv to 2.6 volts and a single ended range between 2.8 volts and $V_{CC}+400$ mv, and yet still provide a constant 400 mv differential signal at the output thereof. The polarity of the 400 mv differential signal is determined by the differential ECL input signal. The preliminary translating of transistors 16 and 18 is provided to avoid possible saturation of differential transistor pair 26 and 28 should the differential ECL signal reach the upper range, thus providing an additional 400 mv of common mode rejection of the differential ECL signal.

The combination of transistors 36 and 38 and resistors 40 and 42 operate as the primary voltage translators for converting the differential ECL signal from a upper rail reference to a lower rail reference. Bias circuit 66 establishes a potential at the bases of transistors 44, 46 and 64 and, correspondingly, collector currents flowing therethrough such that predetermined, temperature compensated voltages are developed at nodes 78 and 80 which are insensitive to power supply variations. Typical values for the voltages at nodes 78 and 80 are 2.0 and 1.6 volts, respectively, for the given polarity of the differential ECL input signal. The voltages at nodes 78 and 80 are applied to the bases of the balanced differential transistor pair comprising transistors 54 and 56 forming a buffer circuit for the reduced differential ECL signal. The voltage developed at node 78 is greater than the voltage at node 80 causing transistor 54 to turn on harder than transistor 56 thereby developing a greater potential across resistor 58 than resistor 60 in response thereto, hence, the voltage at the collector of transistor 56 is more positive than the voltage at the collector of transistor 54. Notably, the sum total of the currents flowing through transistors 54 and 56 is equal to the current flowing through transistor 64 which is equal to the currents flowing through transistors 44 and 46, thereby providing the same temperature compensation for the differential output signal provided at the collectors thereof.

Continuing with the operation, the potentials at the collectors of transistors 54 and 56 now drive the bases of transistors 81 and 110 single-ended since the emitters of the latter transistors are reference to ground potential. The upper drive signal is applied to the base of transistor 81, and the lower drive signal is applied to the base of transistor 110. The values of resistors 92 and 120 are selected such that transistors 81 and 110 are rendered conductive and non-conductive, respectively, when the upper drive signal is greater in magnitude than the lower drive signal, and respectively rendered non-conductive and conductive for the opposite case. The voltage developed across resistor 92 turns on transistor 82 which in turn conducts current through resistors 98 and 100 and turns on transistors 94 and 84. The voltage at the collector of transistor 84 pulls the voltage at the base of transistor 86 low turning the latter off as well as rendering the collector-emitter conduction path of transistor 88 high impedance. Notably, the base of transistor 86 is discharged through the collector of transistor 84 for providing a very fast turn off of these transistors.

Meanwhile, the lower drive signal turns transistor 110 off pulling the base of transistor 112 low and shutting off the current flowing through resistors 126 and 128. This removes the base drive to transistor 114 which then releases the base of transistor 116 turning the latter on and pulling the output voltage at node 108 to a saturation potential. Recall that the upper totem pole of the output stage, transistors 86 and 88, are high impedance. Thus, the output signal at output 118 transistions low when the signal applied at input 12 exceeds the signal applied at input 14.

Reversing the polarity of the differential ECL signal such that the voltage at input 12 is less than the voltage at input 14. The voltages at nodes 78 and 80 switch to 1.6 and 2.0 volts, respectively, and the lower drive signal is now greater in magnitude than the upper drive signal. Correspondingly, transistors 81, 82 and 84 are rendered non-conductive releasing the base of transistor 86 and pulling the output voltage at output 108 to a high level. Likewise, transistors 110, 112 and 114 are rendered conductive and the collector-emitter conduction path of transistor 116 is high impedance.

Notable features of the aforedescribed embodiment of the present invention include operation with a single power supply and the elimination of undesirable current spikes flowing in the output stage during logic transitions. The latter feature is accomplished through the adjustment of the values of resistors 58, 60, 102 and 130. The function of transistors 84 and 114 is to discharge the bases of transistors 86 and 116, respectively. The rate at which the current flowing in the collector of transistor 84 can discharge the base of transistor 86 is, in part, determined by the value of resistor 102 and the capacitance associated therewith; the greater the value of resistor 102, the more current is drawn from the base of transistor 86 into the collector of transistor 84 resulting in a faster turn off time. Likewise, the rate at which transistor 116 is turned off may be increased by increasing the value of resistor 130. A similar control can be applied to transistors 81 and 110 wherein the slew rate at the bases thereof can be manipulated through resistors 58 and 60. It is well understood in the art that the turn on speed of a bipolar transistor is faster than its turn off speed due to the time required to discharge the base. Decreasing the values of resistors 58 and 60 increases the base drive to the transistor receiving the rising edge (turning on), while at the same time reducing the base discharge rate of the transistor receiving the falling edge (turning off) thereby increasing the associated slew rate of the rising edge and reducing the slew rate of the falling edge during the logic transitions. Recall that the rising edge eventually places the corresponding section of the output stage in high impedance while the falling edge renders the associated section of the output stage conductive. Hence, the values of resistors 58 and 60 are selected at predetermined low values to provide unbalanced slew rates for the rising and falling edges of the upper and lower drive signals as each propagates through the drive circuit and enables/disables the corresponding section of the output stage. The slew rate of the rising edge of the drive signal is set slower than the slew rate of the corresponding falling edge insuring that, during a logic transition, the conducting section of the output stage is turned off before the other is turned on. Thus, with proper selection of resistors 58, 60, 102 and 130, the present invention prevents simultaneous conduction of the upper and lower section of the output stage and thereby eliminating current spikes flowing therethrough during logic transitions.

Figure 2:
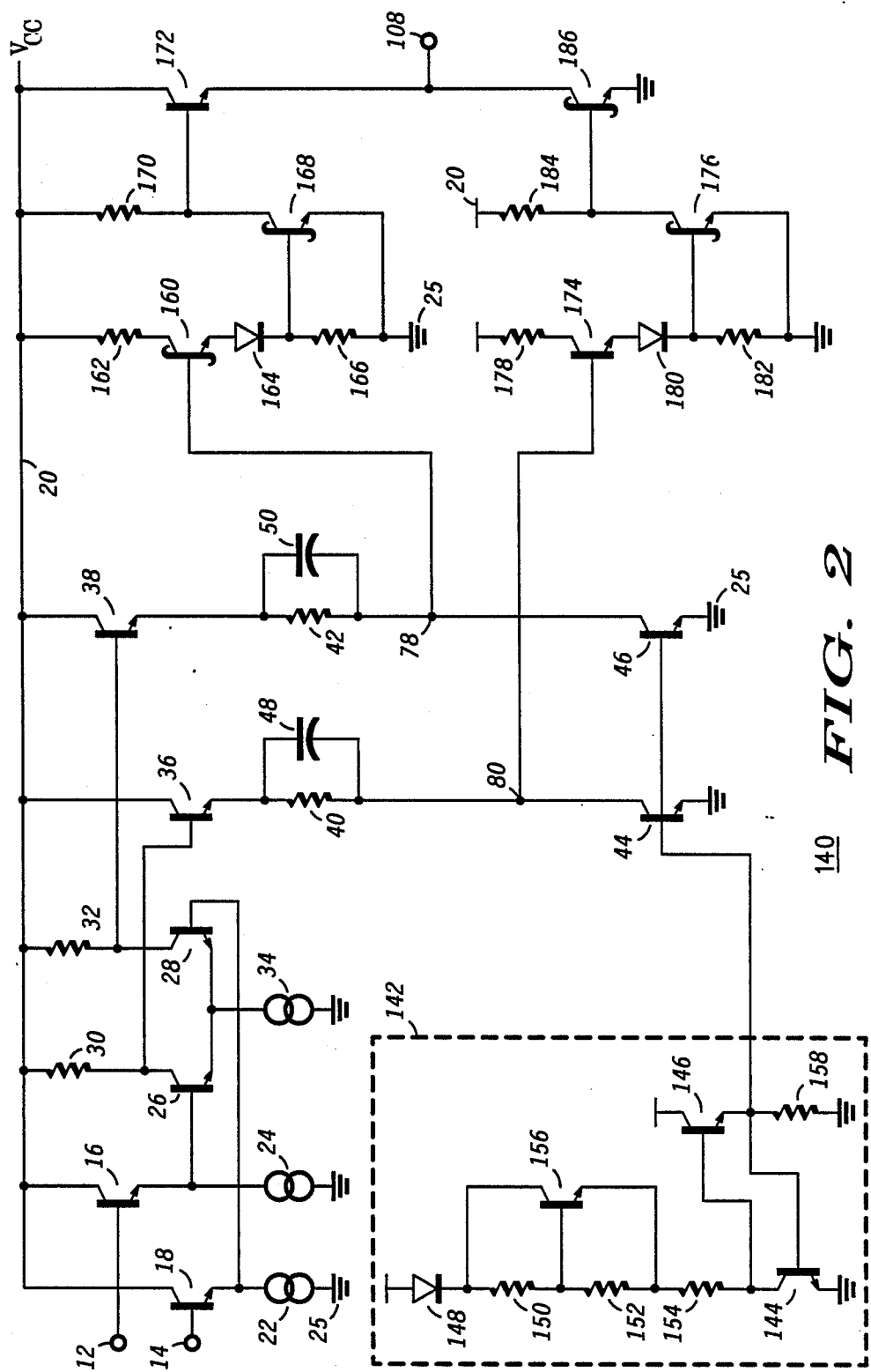
FIG. 2 is a schematic diagram illustrating an alternate embodiment of the present invention.

An alternate embodiment of the present invention is shown in FIG. 2. Similar circuit components are given the same reference number as used in FIG. 1. More specifically, voltage translator 140 includes transistors 16, 18, 26 and 28, current supplies 22, 24 and 34 and resistors 30 and 32 configured as described in the embodiment of FIG. 1. Likewise, transistors 36 and 38 and resistor-capacitor pairs 40, 48 and 42, 50 are coupled in the aforedescribed manner. The collector-emitter conduction paths of transistors 44 and 46 are also coupled between nodes 80 and 78 and power supply conductor 25, respectively, as disclosed in FIG. 1. An improved bias circuit is shown in the embodiment of bias circuit 142 comprising transistors 144 and 146 wherein the collector and base of the former are coupled to the base and emitter of the latter. Diode 148 and resistors 150, 152 and 154 are serially coupled between power supply conductor 20 and the collector of transistor 144 as shown. The collector and base of transistor 156 are coupled to the cathode of diode 148 and the interconnection of resistors 150 and 152, respectively, while the emitter of the same is coupled to the interconnection of resistors 152 and 154. The collector of transistor 146 is coupled to power supply conductor 20, and its emitter is coupled through resistor 158 to power supply conductor 25. In addition, the emitter of transistor 144 is coupled to power supply conductor 25. The voltage developed at the emitter of transistor 146 is then applied to the bases of transistors 44 and 46 for providing a predetermined temperature compensated voltages at nodes 78 and 80 which are desensitized to power supply variation.

The voltage developed at node 78 provides the drive signal for the upper signal path comprising transistors 160, 168 and 172 wherein the upper drive signal is applied to the base of transistor 160 which has a collector coupled through resistor 162 to power supply conductor 20. Diode 164 and resistor 166 are serially coupled between the emitter of transistor 160 and power supply conductors 25. The base and emitter of transistor 168 are then coupled to the cathode of diode 164 and power supply conductor 25 respectively, while its collector is coupled through resistor 170 to power supply conductor 20. The collector of transistor 168 is also coupled to the base of transistor 172, and the collector-emitter conduction path of the latter is coupled between power supply conductor 20 and output terminal 108.

The lower drive signal provided at node 80 is applied to the base of transistor 174 which has a collector coupled through resistor 178 to power supply conductor 20. Diode 180 and resistor 182 are serially coupled between the emitter of transistor 174 and power supply conductor 25. The base and emitter of transistor 176 are then coupled to the cathode of diode 180 and power supply conductor 25, respectively, while its collector is coupled through resistor 184 to power supply conductor 20. The collector of transistor 176 is also coupled to the base of transistor 186, and the collector-emitter conduction path of the latter is coupled between power supply conductor 25 and output terminal 108.

The operation of voltage translator 140 follows a similar discussion of voltage translator 10 wherein the differential ECL signal is voltage level shifted by the $V_{be}$ of transistors 16 and 18 and then applied to the bases of balanced differential transistor pair 26 and 28 which in turn develop a differential voltage across the collectors thereof. The differential ECL signal is converted from a upper rail reference to a lower rail, temperature compensated reference at nodes 78 and 80 for providing upper and lower drive signals at the bases of transistors 160 and 174, respectively. However, voltage translator 140 does not include the differential transistor pair 54 and 56 of FIG. 1. Without this intermediate buffer state, the differential signal developed at the collectors of transistors 26 and 28 must increase, typically to 800 mv, to provide sufficient drive at nodes 78 and 80 to drive the upper and lower signal paths and turn on and turn off the output stage. Thus, voltage translator 140 offers the advantage of fewer components and associated reduction in power consumption over voltage translator 10; however, the former has reduced common mode rejection due to the increased differential drive signal.

Continuing with the assumption that the signal applied at input 12 is greater than the signal applied at input 14, the upper drive signal is more positive than the lower drive signal and, correspondingly, transistor 160 is rendered conductive and transistor 174 is rendered non-conductive. The potential developed across resistor 166 turns on transistor 168 thereby rendering the collector-emitter conduction path of transistor 172 high impedance. Meanwhile, the lower drive signal turns off transistor 174 allowing the voltage at the base of transistor 176 to be pulled low turning the latter transistor off and thereby releasing the base of transistor 186. The output signal at output 108 is reduced to a saturation potential. Reversing the polarity of the differential ECL signal switches the output stage to provide a high output signal.

The alternate embodiment of the present invention also includes operation with a single power supply and the elimination of undesirable current spikes flowing in the output stage during logic transitions. The latter feature is accomplished through the adjustment of the values of resistors 40, 42, 170 and 184 wherein resistors 170 and 184 are selected at a predetermined value to increase the base discharge rate of transistors 172 and 186, respectively. Likewise, the values of resistors 40 and 42 control the slew rate at the bases of transistors 160 and 174. Decreasing the values of resistors 40 and 42 increases the base drive to the transistor receiving the rising edge (turning on), while at the same time reducing the base discharge rate of the transistor receiving the falling edge (turning off) thereby increasing the associated slew rate of the rising edge and reducing the slew rate of the falling edge during the logic transitions. Hence, the values of resistors 40 and 42 are selected at predetermined low values to provide unbalanced slew rates for the rising and falling edges of the upper and lower drive signals as each propagates through the drive circuit and enables/disables the corresponding section of the output stage. The slew rate of the rising edge of the drive signal is set slower than the slew rate of the corresponding falling edge insuring that, during a logic transition, the conducting section of the output stage is turned off before the other is turned on. Thus, resistors 40, 42, 170 and 184 may be selected to prevent simultaneous conduction of the upper and lower section of the output stage and thereby eliminating current spikes flowing therethrough during logic transitions.

Hence, what has been described is a novel voltage translator for translating an ECL input signal to TTL or CMOS compatible levels without introducing current spikes in the output signal thereof. It is understood that this description is made only by way of example and that the present invention may relate equally well to other input and output signals levels

I claim:

1. A circuit responsive to a differential logic input signal having first predetermined logic levels for providing an output signal having second predetermined logic levels, comprising:

an input stage responsive to the differential logic input signal and having first and second outputs for providing first and second differentially related signals in response thereto wherein said first and second differentially related signals have a predetermined differential magnitude;

means for translating said first and second differentially related signals wherein said means for translating is responsive to a bias signal for establishing first and second single-ended levels of said translated first and second differentially related signals while maintaining said predetermined differential magnitude;

a buffer circuit responsive to said translated first and second differentially related signals for providing first and second drive signals each having a predetermined slew rate; and an output stage including first and second switching means serially coupled between first and second sources of operating potential, said first and second switching means being responsive to said first and second drive signals for providing the second predetermined logic levels of the output signal wherein said predetermined slew rates of said first and second drive signals prevent simultaneously conduction through said first and second switching means.

2. The circuit of claim 1 wherein said means for translating comprises:

a first transistor having a base, an emitter and a collector, said base being coupled to said first output of said input stage, said collector being coupled to said first source of operating potential;

a second transistor having a base, an emitter and a collector, said base being coupled to said second output of said input stage, said collector being coupled to said first source of operating potential;

first current supply means having first and second outputs for providing first and second currents of predetermined magnitude and having a control input;

a first resistor having a first terminal coupled to said emitter of said first transistor and having a second terminal coupled to said first output of said first current supply means wherein said translated first differentially related signal is developed at said second terminal of said first resistor; and a second resistor having a first terminal coupled to said emitter of said second transistor and having a second terminal coupled to said second output of said first current supply means wherein said translated second differentially related signal is developed at said second terminal of said second resistor.

3. The circuit of claim 1 further comprising a bias circuit having an output coupled to said control input of said first current supply means for providing said bias signal.

4. The circuit of claim 2 wherein said buffer circuit comprises:

second current supply means having an output for providing a current of predetermined magnitude and having a control input;

a third transistor having a base coupled to said second terminal of said first resistor, and having an emitter and a collector;

a fourth transistor having a base, an emitter and a collector, said base being coupled to said second terminal of said second resistor, said emitters of said third and fourth transistors being coupled together to said output of said second current supply means; and third and fourth resistors respectively coupled between said first source of operating potential and said collectors of said third and fourth transistors.

5. The circuit of claim 4 wherein said buffer circuit further comprises first diode means coupled between said first source of operating potential and said third and fourth resistors.

6. The circuit of claim 5 wherein said bias circuit comprises:

a fifth transistor having a collector coupled to said first source of operating potential, and having an emitter and a base;

a sixth transistor having a base, an emitter and a collector, said base being coupled to said emitter of said fifth transistor and to said control inputs of said first and second current means, said emitter being coupled to said second source of operating potential, said collector being coupled to said base of said fifth transistor;

a fifth resistor coupled between said emitter of said fifth transistor and said second source of operating potential;

second diode means having an anode coupled to said first source of operating potential and having a cathode; and a sixth resistor coupled between said cathode of said second diode means and said collector of said fifth transistor.

7. The circuit of claim 6 wherein said first switching means of said output stage comprises:

a seventh transistor having a base, an emitter and a collector, said base being coupled to said collector of said fourth transistor, said collector being coupled to said first source of operating potential, said emitter being coupled to said second source of operating potential;

an eighth transistor having a base, an emitter and a collector, said base being responsive to the potential developed at said emitter of said seventh transistor, said collector being coupled to said first source of operating potential;

a ninth transistor having a base, an emitter and a collector, said emitter being coupled to said second source of operating potential;

a seventh resistor coupled between said emitter of said eighth transistor and said base of said ninth transistor;

an eighth resistor coupled between said emitter of said eighth transistor and said collector of said ninth transistor;

a tenth transistor having a base, an emitter and a collector, said base being coupled to said emitter of said eighth transistor, said emitter being coupled to said second source of operating potential; and a ninth resistor coupled between said first source of operating potential and said collector of said tenth transistor.

8. The circuit of claim 7 wherein said second switching means of said output stage comprises:

an eleventh transistor having a base, an emitter and a collector, said base being coupled to said collector of said third transistor, said collector being coupled to said first source of operating potential, said emitter being coupled to said second source of operating potential;

a twelfth transistor having a base, an emitter and a collector, said base being responsive to the potential developed at said emitter of said eleventh transistor, said collector being coupled to said first source of operating potential;

a thirteenth transistor having a base, an emitter and a collector, said emitter being coupled to said second source of operating potential;

a tenth resistor coupled between said emitter of said twelfth transistor and said base of said thirteenth transistor;

an eleventh resistor coupled between said emitter of said twelfth transistor and said collector of said thirteenth transistor;

a fourteenth transistor having a base, an emitter and a collector, said base being coupled to said emitter of said twelfth transistor, said emitter being coupled to said second source of operating potential; and a twelfth resistor coupled between said first source of operating potential and said collector of said fourteenth transistor.

9. The circuit of claim 8 wherein said first switching means of said output stage further comprises:

a fifteenth transistor having a base coupled to said collector of said tenth transistor, and having an emitter and a collector;

a sixteenth transistor having a base, an emitter and a collector, said base being coupled to said emitter of said fifteenth transistor, said emitter being coupled to the output of the circuit;

a thirteenth resistor having a first terminal coupled to said collectors of said fifteen and sixteenth transistors and having a second terminal coupled to said first source of operating potential; and a fourteenth resistor coupled between said emitters of said fifteenth and sixteenth transistors.

10. The circuit of claim 9 wherein said second switching means of said output stage further comprises a seventeenth transistor having a base, an emitter and a collector, said base being coupled to said collector of said fourteenth transistor, said collector being coupled to the output of the circuit, said emitter being coupled to said second source of operating potential.

11. The circuit of claim 10 wherein said input stage comprises:
   third current supply means having a plurality of outputs for providing currents of predetermined magnitudes;
   an eighteenth transistor having a base, an emitter and a collector, said collector being coupled to said first source of operating potential, said emitter being coupled to a first output of said third current supply means;
   a nineteenth transistor having a base, an emitter and a collector, said bases of said eighteenth and nineteenth transistors being coupled for receiving the differential logic input signal, said collector being coupled to said first source of operating potential, said emitter being coupled to a second output of said third current supply means;
   a twentieth transistor having a base, an emitter and a collector, said base being coupled to said emitter of said eighteenth transistor, said collector being coupled to said first output of said input stage;
   a twenty-first transistor having a base, an emitter and a collector, said base being coupled to said emitter of said nineteenth transistor, said emitters of said twentieth and twenty-first transistors being coupled together to a third output of said third current supply means, said collector being coupled to said second output of said input stage;
   a fifteenth resistor coupled between said collector of said twentieth transistor and said first source of operating potential; and
   a sixteenth resistor coupled between said collector of said twenty-first transistor and said first source of operating potential.

12. A voltage translator responsive to a differential logic input signal having first predetermined logic levels for providing an output signal having second predetermined logic levels, comprising:
   an input stage responsive to the differential logic input signal and having first and second outputs for providing first and second differentially related signals in response thereto wherein said first and second differentially related signals have a predetermined differential magnitude;
   means for translating said first and second differentially related signals wherein said means for translating is responsive to a bias signal for establishing first and second single-ended levels of said translated first and second differentially related signals while maintaining said predetermined differential magnitude; and
   an output stage including first and second switching means serially coupled between first and second sources of operating potential, said first and second switching means being responsive to said first and second single-ended levels of said translated first and second differentially related signals for providing the second predetermined logic levels of the output signal wherein the slew rates of said translated first and second differentially related signals prevent simultaneously conduction through said first and second switching means.

13. The voltage translator of claim 12 wherein said means for translating comprises:
   a first transistor having a base, an emitter and a collector, said base being coupled to said first output of said input stage, said collector being coupled to said first source of operating potential;
   a second transistor having a base, an emitter and a collector, said base being coupled to said second output of said input stage, said collector being coupled to said first source of operating potential;
   first current supply means having first and second outputs for providing first and second currents of predetermined magnitude and having a control input;
   a first resistor having a first terminal coupled to said emitter of said first transistor and having a second terminal coupled to said first output of said first current supply means wherein said translated first differentially related signal is developed at said second terminal of said first resistor; and
   a second resistor having a first terminal coupled to said emitter of said second transistor and having a second terminal coupled to said second output of said first current supply means wherein said translated second differentially related signal is developed at said second terminal of said second resistor.

14. The voltage translator of claim 12 further comprising
   a bias circuit having an output coupled to said control input of said first current supply means for providing said bias signal.

15. The voltage translator of claim 13 wherein said bias circuit comprises:
   a third transistor having a collector coupled to said first source of operating potential, and having an emitter and a base;
   a fourth transistor having a base, an emitter and a collector, said base being coupled to said emitter of said third transistor and to said control inputs of said first and second current means, said emitter being coupled to said second source of operating potential, said collector being coupled to said base of said third transistor;
   a third resistor coupled between said emitter of said third transistor and said second source of operating potential;
   first diode means having an anode coupled to said first source of operating potential and having a cathode;
   a fourth resistor having a first terminal coupled to said cathode of said diode means and having a second terminal;
   a fifth resistor having a first terminal coupled to said collector of said fourth transistor and having a second terminal;
   a sixth resistor coupled between said second terminals of said fourth and fifth resistors; and
   a fifth transistor having a base, an emitter and a collector, said collector being coupled to said first terminal of said fourth resistor, said base being coupled to said second terminal of said fourth resistor, said emitter being coupled to said second terminal of said fifth resistor.

16. The voltage translator of claim 15 wherein said first switching means of said output stage comprises:

a sixth transistor having a base, an emitter and a collector, said base being coupled to said second terminal of said first resistor, said collector being coupled to said first source of operating potential;

second diode means having an anode coupled to said emitter of said sixth transistor and having a cathode;

a seventh transistor having a base, an emitter and a collector, said base being coupled to said cathode of said second diode means, said emitter being coupled to said second source of operating potential;

a seventh resistor coupled between said base and emitter of said seventh transistor; and an eighth resistor coupled between said first source of operating potential and said collector of said seventh transistor.

17. The voltage translator of claim 16 wherein said second switching means of said output stage comprises:

an eighth transistor having a base, an emitter and a collector, said base being coupled to said second terminal of said second resistor, said collector being coupled to said first source of operating potential;

third diode means having an anode coupled to said emitter of said eighth transistor and having a cathode;

a ninth transistor having a base, an emitter and a collector, said base being coupled to said cathode of said third diode means, said emitter being coupled to said second source of operating potential;

a ninth resistor coupled between said base and emitter of said ninth transistor; and a tenth resistor coupled between said first source of operating potential and said collector of said ninth transistor.

18. The voltage translator of claim 17 wherein said first switching means of said output stage further comprises a tenth transistor having a base, an emitter and a collector, said base being coupled to said collector of said seventh transistor, said emitter being coupled to the output of the circuit, said collector being coupled to said first source of operating potential.

19. The voltage translator of claim 18 wherein said second switching means of said output stage further comprises an eleventh transistor having a base, an emitter and a collector, said base being coupled to said collector of said ninth transistor, said collector being coupled to the output of the circuit, said emitter being coupled to said second source of operating potential.

20. The voltage translator of claim 19 wherein said input stage comprises:

third current supply means having a plurality of outputs for providing currents of predetermined magnitudes;

a twelfth transistor having a base, an emitter and a collector, said collector being coupled to said first source of operating potential, said emitter being coupled to a first output of said third current supply means;

a thirteenth transistor having a base, an emitter and a collector, said bases of said twelfth and thirteenth transistors being coupled for receiving the differential logic input signal, said collector being coupled to said first source of operating potential, said emitter being coupled to a second output of said third current supply means;

a fourteenth transistor having a base, an emitter and a collector, said base being coupled to said emitter of said twelfth transistor, said collector being coupled to said first output of said input stage;

a fifteenth transistor having a base, an emitter and a collector, said base being coupled to said emitter of said thirteenth transistor, said emitters of said fourteenth and fifteenth transistors being coupled together to a third output of said third current supply means, said collector being coupled to said second output of said input stage;

an eleventh resistor coupled between said collector of said fourteenth transistor and said first source of operating potential; and a twelfth resistor coupled between said collector of said fifteenth transistor and said first source of operating potential.

21. An integrated voltage translator responsive to a differential logic input signal having first predetermined logic levels for providing an output signal having second predetermined logic levels, comprising:

an input stage responsive to the differential logic input signal and having first and second outputs for providing first and second differentially related signals in response thereto wherein said first and second differentially related signals have a predetermined differential magnitude;

means for translating said first and second differentially related signals wherein said means for translating is responsive to a bias signal for establishing first and second single-ended levels of said translated first and second differentially related signals while maintaining said predetermined differential magnitude; and an output stage including first and second switching means serially coupled between first and second sources of operating potential, said first and second switching means being responsive to said first and second single-ended levels of said translated first and second differentially related signals for providing the second predetermined logic levels of the output signal wherein the slew rates of said translated first and second differentially related signals prevent simultaneously conduction through said first and second switching means.

22. A voltage translator including an output stage having first and second switching means serially coupled between first and second sources of operating potential for providing an output signal having predetermined logic levels, comprising:

an input stage responsive to a differential logic input signal and having first and second outputs for providing first and second differentially related signals in response thereto wherein said first and second differentially related signals have a predetermined differential magnitude;

first means for translating said first and second differentially related signals and providing first and second single-ended levels of said first and second differentially related signals at first and second outputs while maintaining said predetermined differential magnitude;

first current supply means having first and second inputs and a control input, said first and second inputs being coupled to said first and second outputs of said first means for sinking first and second currents of predetermined magnitude which establishes said first and second single-ended levels of said first and second differentially related signals;

a bias circuit having an output coupled to said control input of said first current supply means for providing said bias signal; and second means responsive to said translated first and second differentially related signals and having first and second outputs coupled to the first and second switching means respectively for generating first and second drive signals each having predetermined slew rate wherein said predetermined slew rates of said first and second drive signals prevent simultaneous conduction through the first and second switching means.

23. The voltage translator of claim 22 wherein said first means comprises:

a first transistor having a base, an emitter and a collector, said base being coupled to said first output of said input stage, said collector being coupled to the first source of operating potential;

a second transistor having a base, an emitter and a collector, said base being coupled to said second output of said input stage, said collector being coupled to the first source of operating potential;

a first resistor having a first terminal coupled to said emitter of said first transistor and having a second terminal coupled to said first output of said first current supply means wherein said translated first differentially related signal is developed at said second terminal of said first resistor; and a second resistor having a first terminal coupled to said emitter of said second transistor and having a second terminal coupled to said second output of said first current supply means wherein said translated second differentially related signal is developed at said second terminal of said second resistor.

24. The voltage translator of claim 23 wherein said second means includes first conduction path comprising:

a third transistor having a base, an emitter and a collector, said base being coupled to said second terminal of said first resistor, said collector being coupled to the first source of operating potential;

first diode means having an anode coupled to said emitter of said third transistor and having a cathode;

a fourth transistor having a base, an emitter and a collector, said base being coupled to said cathode of said first diode means, said emitter being coupled to the second source of operating potential;

a third resistor coupled between said base and emitter of said fourth transistor; and a fourth resistor coupled between the first source of operating potential and said collector of said fourth transistor wherein said first drive signal is developed at said collector of said fourth transistor.

25. The voltage translator of claim 24 wherein said second means includes a second conduction path comprising:

a fifth transistor having a base, an emitter and a collector, said base being coupled to said second terminal of said second resistor, said collector being coupled to the first source of operating potential;

second diode means having an anode coupled to said emitter of said fifth transistor and having a cathode;

a sixth transistor having a base, an emitter and a collector, said base being coupled to said cathode of said second diode means, said emitter being coupled to the second source of operating potential;

a fifth resistor coupled between said base and emitter of said sixth transistor; and a sixth resistor coupled between the first source of operating potential and said collector of said sixth transistor wherein said second drive signal is developed at said collector of said sixth transistor.

26. The voltage translator of claim 22 further comprising a buffer circuit coupled between said first means and said second means for reducing the predetermined differential magnitude of said first and second differentially related signals required to achieve said predetermined magnitude and predetermined slew rate of said first and second drive signals.

27. The circuit of claim 26 wherein said first means comprises:

a first transistor having a base, an emitter and a collector, said base being coupled to said first output of said input stage, said collector being coupled to the first source of operating potential;

a second transistor having a base, an emitter and a collector, said base being coupled to said second output of said input stage, said collector being coupled to the first source of operating potential;

first current supply means having first and second outputs for providing first and second currents of predetermined magnitude and having a control input;

a first resistor having a first terminal coupled to said emitter of said first transistor and having a second terminal coupled to said first output of said first current supply means wherein said translated first differentially related signal is developed at said second terminal of said first resistor; and a second resistor having a first terminal coupled to said emitter of said second transistor and having a second terminal coupled to said second output of said first current supply means wherein said translated second differentially related signal is developed at said second terminal of said second resistor.

28. The circuit of claim 27 wherein said first means further comprises:

a bias circuit having an output coupled to said control input of said first current supply means for establishing said predetermined single-ended levels of said translated first and second differentially related signals; and first and second capacitive means coupled in parallel with said first and second resistors respectively for providing a bi-pass for high frequency components of said translated first and second differentially related signals.

29. The circuit of claim 28 wherein said buffer circuit comprises:

second current supply means having an output for providing a current of predetermined magnitude and having a control input coupled to said output of said bias circuit;

a third transistor having a base coupled to said second terminal of said first resistor, and having an emitter and a collector;

a fourth transistor having a base, an emitter and a collector, said base being coupled to said second terminal of said second resistor, said emitters of said third and fourth transistors being coupled together to said output of said second current supply means; and third and fourth resistors respectively coupled between the first source of operating potential and said collectors of said third and fourth transistors.

30. The circuit of claim 29 wherein said buffer circuit further comprises first diode means coupled between the first source of operating potential and said third and fourth resistors.

31. The voltage translator of claim 30 wherein said second means includes first conduction path comprising:
- a fifth transistor having a base, an emitter and a collector, said base being coupled to said collector of said third transistor, said collector being coupled to the first source of operating potential;
- second diode means having an anode coupled to said emitter of said fifth transistor and having a cathode;
- a sixth transistor having a base, an emitter and a collector, said base being coupled to said cathode of said second diode means, said emitter being coupled to the second source of operating potential;
- a fifth resistor coupled between said base and emitter of said sixth transistor; and
- a sixth resistor coupled between the first source of operating potential and said collector of said sixth transistor wherein said first drive signal is developed at said collector of said sixth transistor.

32. The voltage translator of claim 31 wherein said second means includes a second conduction path comprising:
- a seventh transistor having a base, an emitter and a collector, said base being coupled to said collector of said fourth transistor, said collector being coupled to the first source of operating potential;
- third diode means having an anode coupled to said emitter of said seventh transistor and having a cathode;
- an eighth transistor having a base, an emitter and a collector, said base being coupled to said cathode of said third diode means, said emitter being coupled to the second source of operating potential;
- a seventh resistor coupled between said base and emitter of said eighth transistor; and
- a eighth resistor coupled between the first source of operating potential and said collector of said eighth transistor wherein said second drive signal is developed at said collector of said eighth transistor.

* * * * *